(12) United States Patent
Kulkarni et al.

(10) Patent No.: US 7,902,047 B2
(45) Date of Patent: Mar. 8, 2011

(54) DUAL CHAMBER SYSTEM PROVIDING SIMULTANEOUS ETCH AND DEPOSITION ON OPPOSING SUBSTRATE SIDES FOR GROWING LOW DEFECT DENSITY EPITAXIAL LAYERS

(75) Inventors: Nagraj S. Kulkarni, Knoxville, TN (US); Richard J. Kasica, Ashburn, VA (US)

(73) Assignee: The United States of America as represented by the United States Department of Energy, Washington, DC (US)

( * ) Notice: Subject to any disclaimer, the term of this patent is extended or adjusted under 35 U.S.C. 154(b) by 78 days.

(21) Appl. No.: 12/180,280

(22) Filed: Jul. 25, 2008

(65) Prior Publication Data

US 2010/0013052 A1 Jan. 21, 2010

Related U.S. Application Data

(60) Provisional application No. 61/081,995, filed on Jul. 18, 2008.

(51) Int. Cl.
*H01L 21/20* (2006.01)
*H01L 21/36* (2006.01)

(52) U.S. Cl. .................. 438/478; 438/492; 438/695
(58) Field of Classification Search .................. 438/478, 438/492, 497, 500, 503, 507, 695
See application file for complete search history.

(56) References Cited

U.S. PATENT DOCUMENTS

| | | | | |
|---|---|---|---|---|
| 5,679,152 | A * | 10/1997 | Tischler et al. | 117/97 |
| 6,897,138 | B2 * | 5/2005 | Watanabe et al. | 438/604 |
| 7,288,830 | B2 * | 10/2007 | Shibata | 257/615 |
| 7,332,031 | B2 * | 2/2008 | Tischler et al. | 117/97 |

* cited by examiner

*Primary Examiner* — Charles D Garber
*Assistant Examiner* — Bryan R Junge
(74) *Attorney, Agent, or Firm* — Esther L. Bell; John T. Lucas

(57) ABSTRACT

A dual-chamber reactor can include a housing enclosing a volume having a divider therein, where the divider defines a first chamber and a second chamber. The divider can include a substrate holder that supports at least one substrate and exposes a first side of the substrate to the first chamber and a second side of the substrate to the second chamber. The first chamber can include an inlet for delivering at least one reagent to the first chamber for forming a film on the first side of the substrate, and the second chamber can include a removal device for removing material from the second side of the substrate.

1 Claim, 2 Drawing Sheets

DUAL CHAMBER SYSTEM PROVIDING SIMULTANEOUS ETCH AND DEPOSITION ON OPPOSING SUBSTRATE SIDES FOR GROWING LOW DEFECT DENSITY EPITAXIAL LAYERS

CROSS-REFERENCE TO RELATED APPLICATIONS

This application claims priority to U.S. Provisional Application Ser. No. 61/081,995 filed Jul. 18, 2008, the disclosure of which is hereby incorporated by reference.

STATEMENT REGARDING FEDERALLY SPONSORED RESEARCH OR DEVELOPMENT

The United States Government has rights in this invention pursuant to Contract No. DE-AC05-00OR22725 between the United States Department of Energy and UT-Battelle, LLC.

FIELD OF THE INVENTION

The invention relates to a system for forming thin film devices, including devices having Group III-N thin films which have poor lattice matching with the substrate onto which they are deposited.

BACKGROUND OF THE INVENTION

Group III-N compounds, such as gallium nitride (GaN) and its related alloys have seen significant research in recent years due to their applications in electronic and optoelectronic devices. Particular examples of potential optoelectronic devices include blue light emitting and laser diodes. The large bandgap and high electron saturation velocity provided by certain III-N compounds also make them excellent candidates for applications in high temperature and high-speed power electronics.

Due to the high equilibrium pressure of nitrogen at typical growth temperatures, it is extremely difficult to obtain GaN bulk crystals. Owing to the lack of feasible bulk growth methods, GaN is commonly deposited epitaxially on substrates such as SiC and sapphire ($Al_2O_3$). However, a current problem with the manufacture of GaN thin films is that there is no readily available suitable substrate material which exhibits close lattice matching and close matching of thermal expansion coefficients.

SiC is a semiconducting material which provides excellent thermal conductivity, but is expensive and is presently available only in small wafer sizes. Direct growth of GaN on SiC is generally difficult due to poor wetting between these materials. Although buffer layers, such as AlN or AlGaN, can be used to address this wetting problem, such layers increase the resistance between the device and the substrate. In addition, it is very difficult to prepare a SiC layer having a smooth surface. A rough interface with GaN can cause an increase in the defect density of the GaN layer.

Presently, (0001) oriented $Al_2O_3$ (sapphire) is the most frequently used substrate for GaN epitaxial growth due to its low price, availability of large-area wafers with good crystallinity and stability at high temperature. However, the lattice mismatch between GaN and sapphire is over 13%. Such a large mismatch in the lattice constants causes poor crystal quality when GaN films are grown directly on the sapphire, due to stress formation and a high density of defects, including such defects as threading dislocations, microtwins, stacking faults and deep-levels. Sapphire is also an electrical insulator. Use of electrically insulating substrates can complicate certain processing by requiring additional processing steps, as compared to a conducting or semiconducting substrate, due to the inability to make an electrical contact through the substrate. Lattice mismatch may have a larger effect on the dislocation densities than thermal mismatch issues.

Silicon is increasingly being used as a substrate for GaN materials. Silicon substrates have been considered for use as substrates for growth of GaN films. Silicon substrates for GaN growth are attractive given their low cost, large diameter, high crystal and surface quality, controllable electrical conductivity, and high thermal conductivity. The use of Si wafers promises easy integration of GaN-based optoelectronic devices with Si based electronic devices.

The disadvantages of Si as a substrate for GaN heteroepitaxy include a +20.5% a-plane misfit which initially led to the conclusion that growth of GaN directly on silicon was not feasible. In addition, the thermal expansion mismatch between GaN ($5.6 \times 10^{-6}$ $K^{-1}$) and Si ($6.2 \times 10^{-6}$ $K^{-1}$) of 9.6% can lead to cracking upon cooling in films grown at high temperature. Thus, direct growth of GaN on substrates including Si has been found to result in either polycrystalline growth, substantial diffusion of Si into the GaN film and/or a relatively high GaN dislocation density (e.g. $10^{10}$ $cm^{-2}$). Moreover, GaN is also known to poorly nucleate on Si substrates, leading to an island-like GaN structure and poor surface morphology. Thus, the quality of GaN films grown on silicon has been far inferior to that of films grown on other commonly used substrates such as sapphire or silicon carbide. Moreover, the growth conditions that have been used for GaN on Si are generally not compatible with standard silicon processes.

Numerous different buffer layers have been disclosed for insertion between the Si substrate and the GaN layer to relieve lattice strain and thus improve GaN crystal quality. However, even when buffer layers are used, typically the effect of the thermal expansion coefficient mismatch is too large to suppress the formation of cracks in the GaN and related other Group III-N films grown. Thin AlN, GaAs, AlAs, SiC, $SiO_2$, $Si_3N_4$ and ZnO, boron monophosphide (BP) or low-temperature GaN layers are exemplary buffer layers have been used for GaN growth on Si.

Typically, GaN substrates have dislocation densities around $10^9$ to $10^{10}/cm^2$. Lower threading dislocation densities around $10^7/cm^2$ may be achievable using a technique called pendio-epitaxy or cantilever epitaxy. However, the lowest values for the threading dislocation densities are only obtained over a narrow region or mesa, which is a few micrometers in length. Properties of LED's, including the internal quantum efficiency (IQE) and lifetime, are deleteriously affected due to the presence of these threading dislocations.

SUMMARY OF THE INVENTION

In one aspect of the exemplary embodiments, a dual-chamber reactor can include a housing enclosing a volume having a divider therein, where the divider defines a first chamber and a second chamber. The divider can include a substrate holder that supports at least one substrate and exposes a first side of the substrate to the first chamber and a second side of the substrate to the second chamber. The first chamber can include an inlet for delivering at least one reagent to the first chamber for forming a film on the first side of the substrate, and the second chamber can include a removal device for removing material from the second side of the substrate.

In another aspect of the exemplary embodiments, a method of forming a low defect epitaxial film can include providing a single crystal substrate having a first side and a second side opposite to the first side; and depositing an epitaxial layer on the first side of the substrate while removing material from the second side of the substrate.

In another aspect of the exemplary embodiments, a low defect epitaxial film can be formed by a process of growing the film on a first side of a substrate while removing material from a second side of the substrate, where the film has a threading dislocation density less than $10^5/cm^2$.

BRIEF DESCRIPTION OF THE DRAWINGS

A fuller understanding of the present invention and the features and benefits thereof will be accomplished upon review of the following detailed description together with the accompanying drawings, in which.

DETAILED DESCRIPTION

Figure 1:
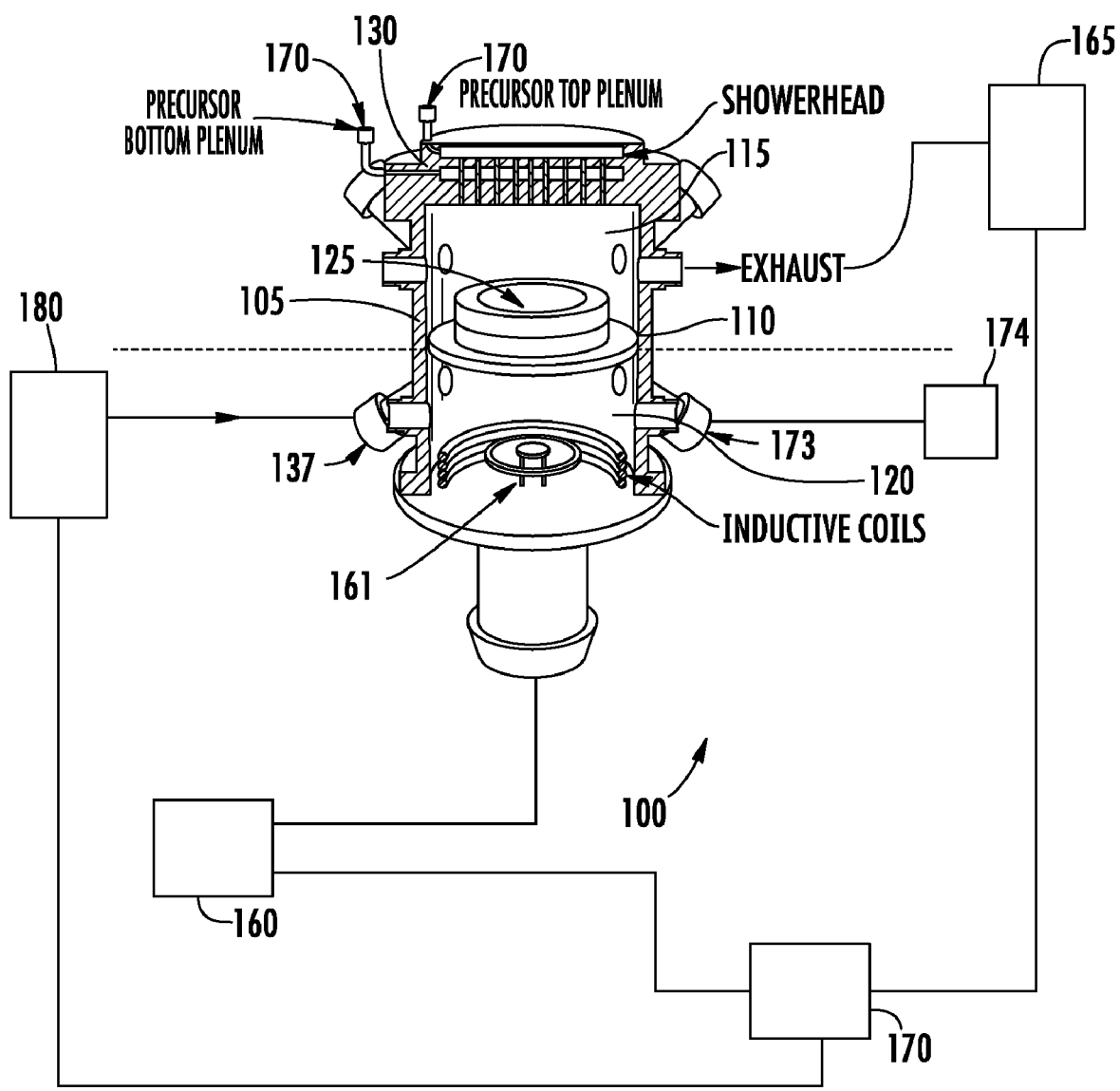
FIG. 1 shows a cross-sectional view of an exemplary dual-chamber reactor according to an exemplary embodiment of the present invention.

Thinning of a substrate to maintain critical thickness values during the deposition of an epitaxial film has been found by the present Inventors to reduce lattice mismatch stresses in the film. The substrate can be thinned (e.g., continuously) by etching from the backside so that it accommodates the mismatch strain in the epitaxial film to a greater extent as the film grows thicker and thicker. Lower stresses in the epitaxial film during deposition can result in epitaxial films having a lower defect density. Lower defect density epitaxial films can permit improved device performance, such as for LED devices and power transistors. In a preferred embodiment, the epitaxial film can be grown on thinned substrate regions at the center of the wafer, while at the edges, the substrate can be relatively thick and interfacial stress will be relaxed by misfit dislocations and other defects in the film which are preferentially formed over those regions.

In one exemplary embodiment, where local equilibrium exists between the substrate and the film, the defects formed in the edge regions where thinning does not take place may not propagate into the center regions where thinning is taking place. In another embodiment, a plurality of thinned regions of the substrate can be separately located over the substrate (i.e., not in a single continuous region). For example, lithography can be used to create localized regions of the substrate that are thinned. While the exemplary embodiment describes the thinned region of the substrate being a central region thereof, the present disclosure contemplates other locations of the substrate being the thinned region or regions.

In one exemplary embodiment, a dual-chamber reactor can be utilized for growing of the film and thinning of the substrate, such as a reactor comprising a housing enclosing a volume having a divider therein. The divider can define a first chamber and a second chamber. The divider can include a substrate holder that supports at least one wafer and can expose a first side (e.g., topside) of the wafer to the first chamber and a second side (e.g., backside) of the wafer to the second chamber. The first chamber can include an inlet for delivering at least one reagent to the first chamber for forming a film which is deposited on the first side of the wafer. The second chamber can include a structure for removing material, such as substrate material, from the second side of the wafer. The exemplary embodiment of the reactor can allow one side of the wafer to receive a deposition while the second side receives a material removal process, such as an etch, or polishing process. The deposition and removal processes can be performed simultaneously by the reactor and/or can be performed at different times, such as in an alternating pattern or some other sequence. In one embodiment, removal of substrate material from the backside of the wafer may be commenced prior to the deposition of the film on the topside of the substrate.

In one embodiment, the reactor can contain multiple wafers with multiple substrate holders/dividers (e.g., one for each wafer), such as for simultaneous processing of the wafers. In another embodiment, the reactor can utilize a single etch chamber to etch the backside of each of the wafers.

The exemplary embodiments can be useful for the growth of low defectivity epitaxial films and can allow the formation of high quality epitaxial films, even when the epitaxial film is relatively thick (e.g., 100-1000 microns) and/or the epitaxial film and the substrate have significantly different lattice parameters and thermal expansion coefficients. For example, the exemplary embodiments described herein can be utilized for the epitaxial growth of GaN on a single crystal Si substrate. The thermal expansion misfit between GaN ($5.6\times10^{-6}$ $K^{-1}$) and Si ($6.2\times10^{-6}$ $K^{-1}$) is 9.6%, which can lead to cracking upon cooling for GaN films of practical thicknesses grown on substrates at high temperature using contemporary methods. The exemplary embodiments contemplate the use of various types of substrate, including preferably single crystal sapphire, as well as others such as Si, SiC, $LiGaO_2$, and so forth for growth of films, such as GaN growth in the exemplary embodiments. The resulting film can have a threading dislocation density less than $10^5/cm^2$.

In one exemplary embodiment, the reactor can grow epitaxial GaN on a single crystal substrate (e.g. Si <111>) in the upper chamber, while simultaneously etching the underside of the single crystal substrate in the bottom chamber of the reactor. In this embodiment, the deposition process can comprise a metalorganic vapor phase epitaxy process (MOVPE; also referred to as metal organic chemical vapor deposition (MOCVD)), and the removal process can comprise plasma etching, such as through application of plasma etch gases including fluorocarbons (e.g., $CF_4$), $BCl_3$, halides or their mixtures, $NH_3$, $H_2$, and so forth. Other plasma systems and techniques can also be used, e.g., microwave plasma system. The present disclosure also contemplates the use of other processes for the removal of portions of the substrate, including wet etching using chemicals.

FIG. 1 shows a schematic cross-sectional illustration of an exemplary embodiment of a dual-chamber reactor 100. Dual-chamber reactor 100 can include a housing 105 enclosing a volume having a divider 110 therein. The divider 110 can define a first chamber 115 and a second chamber 120. The divider 110 can include a substrate holder that supports at least one wafer and exposes a first side (e.g., topside) of the substrate wafer 125 to the first chamber 115 and a second side (e.g., backside) of the wafer 125 to the second chamber 120. The particular structure and technique used to hold the substrate in position in the reactor 100 can vary, including the use of a robotic arm or the like for positioning therein. When the wafer is loaded in the substrate holder, the first chamber 115 and a second chamber 120 can be isolated from one another such that the respective chambers can be maintained at different pressure levels, and so that chemical species used in one chamber do not measurably contaminate the other chamber. The particular pressure differential can vary and in one embodiment can be adjusted, such as based on the thickness of the substrate, the substrate material and so forth. The particular structure, materials and techniques utilized to seal the substrate to the reactor 100 and thus partially define the first and second chambers 115 and 120 can vary and should be understood by one of ordinary skill in the art. For instance, the substrate may be positioned between two rings or other structures providing access to a portion of the topside and backside of the substrate while applying a force to the substrate to hold it in position and seal the first and second chambers 115, 120.

The first chamber 115 shown in FIG. 1 can include a vertical flow, shower-head gas distributor 130 having a plurality of showerhead-like inlets for delivering at least one reagent (shown as a precursor) to the first chamber 115 for forming a film deposited on the first side of the substrate 125. The growth chamber system shown is based on vertical flow cold-wall reactor techniques, such as those used to deposit compound semiconductors. The showerhead 130 near the precursor inlets serves as a gas distribution mechanism to promote uniform gas flow within the reactor chamber 115. The epitaxial film deposition can occur on a single crystal substrate positioned near the center of the chamber. However, the present disclosure contemplates the substrate being positioned in various locations of the chamber based on a number of factors, including the method of deposition, the type of substrate holders and the substrate removal process being utilized. In the case of GaN deposition, trimethylgallium (TMG) and ammonia ($NH_3$) can be the reagents utilized, and the substrate can be heated to temperatures of about 500 to 1100° C.

For crystal growth of epitaxial III-V Nitride thin films, MOVPE, and molecular beam epitaxy (MBE) are generally preferred since they have grown the highest quality GaN based materials to date. However, particularly for applications other than GaN and related materials, the present invention can utilize other deposition techniques, including physical vapor deposition (thermal or electron beam evaporation, sputtering, and so forth), ion-beam deposition, and other processes.

In reactor 100 shown in FIG. 1, substrate heating can be provided by halogen heatbank 161 with temperature feedback control provided by an optical pyrometer 174 which receives optical data via pyroport 173. Other heating arrangements and/or control techniques can also be used. In one embodiment, optical viewport 137 can be integrated with reactor 100 to allow in-situ monitoring of the growing film, such as via spectroscopy, including spectroscopic ellipsometry.

Spectroscopic ellipsometry can use light in the ultraviolet to infrared region (200-1700 nm or 6.2 to 0.73 eV), so the light will pass through virtually any film growth environment, including ions, electric or magnetic fields. Spectroscopic ellipsometry can be sensitive to many of the characteristics of film growth, including film thickness, optical properties of the film and substrate, and surface and interface roughness. For film growth GaN on a Si substrate, the ultraviolet part of the spectrum (<360 nm or >3.4 eV) can be absorbed in the first 10 nm of the film, so there can be high sensitive to the optical properties of the deposited film (such as the exciton at the band edge) and the surface roughness. The visible to near infrared (360-1100 nm or 3.4-1.13 eV) region can be sensitive to the film thickness, refractive index of the GaN film, and the surface and interface roughness. The infrared region (1100-1700 nm or 1.13-0.73 eV) can also penetrate the silicon substrate, and can become sensitive to the silicon thickness when this thickness becomes thin (<~5-10 microns). In addition, Spectroscopic ellipsometry measurements can also be performed quickly (seconds or minutes, depending on the data and signal-to-noise required).

In a preferred embodiment, the ellipsometry ports are positioned near the top of the reactor 100 to obtain topside measurements. Where an etching process is utilized that results in a rough backside, light scatter can make obtaining back-side spectroscopic ellipsometry measurements difficult while front-side measurements may not retrieve useful data due to the silicon-gas interface. In another embodiment, reflection high-energy electron diffraction can be used to monitor the process, including characterizing the surface of crystalline materials. The present disclosure contemplates the use of other monitoring techniques, including transmission electron microscopy and low energy electron diffraction. In one embodiment, at specified periods during the process, the process can be stopped to obtain parameters (e.g., measure the thicknesses externally including using SEM, TEM, AFM techniques) and a suitable calibration scheme can be generated that provides the thicknesses of the substrate and film for those process conditions at any time during the process.

The second chamber 120 can include components for removing material from the second side of the wafer. In the exemplary embodiment, the second chamber 120 is shown as a reactive ion etch chamber for maintaining critical thickness values during the deposition. The critical thickness can be a film thickness threshold which is based on the elastic properties, lattice mismatch, and crystal structures of the film material and the underlying substrate material. When the critical thickness is reached, the formation of a high density of defects such as misfit dislocations in the film can result. One parameter that can influence or control the critical thickness of the film in addition to the parameters listed above is the substrate thickness. The critical thickness can increase as the substrate thickness decreases. In one embodiment, by thinning the substrate from the bottom as film growth proceeds on the top of the substrate, the formation of interface misfit dislocations and other defects can be substantially or completely prevented since the thickness of the growing film will be maintained below the critical thickness.

The critical thickness can be determined by using x-ray diffraction and other methods as referenced in "Comparison of X-ray diffraction methods for determination of the critical layer thickness for dislocation multiplication", *Journal of Electronic Materials* 28(5): 553-558, the disclosure of which is incorporated herein by reference. Below the critical thickness, the film can be strained to match the in-plane lattice parameter of the substrate, i.e., the film is below its elastic limit. Above the critical thickness, a relaxation of strain can be observed, along with the appearance of dislocations and other defects.

In one embodiment, the backside of the substrate can be plasma etched simultaneously with the topside film growth process to minimize the formation of dislocations at the substrate/film interface. In the exemplary embodiment, the structure for removing material from the second side of the wafer is shown in FIG. 1 as being a remotely located plasma generating system 160, such as an inductively-coupled plasma (ICP). The ICP can generate reactive plasma species which are fed into chamber 120 thus providing a plasma etching in chamber 120. The reactive plasma species can etch the exposed bottom part of the substrate 125. Processing conditions such as power, pressure, gas flow, and substrate biasing are preferably monitored to allow controlled etching of the substrate. The present disclosure contemplates other removal processes being utilized, including conventional plasma etching, reactive ion etching (RIE), chemical mechanical polishing (CMP), and sputtering. In one embodiment, any removal process that does not cause significant perturbations in the substrate and the growing film can be utilized (e.g., wet etching). Electrochemical mechanical polishing (ECMP) can be used where the substrate is conductive. In another embodiment, CMP can be used to reduce the initial thickness of the substrate to the lowest possible thickness that can be handled (e.g., a few hundred nm) prior to insertion into the dual-chamber reactor 100. Use of CMP as a pre-process reduction of the substrate can improve process efficiency since etching to cause thinning of the substrate is a slower process.

Reactor 100 can include a central processor or controller 170. In one embodiment, an ellipsometer can be communicably coupled to the processor 170, as is ICP 160 and vacuum pump 165, which are used to maintain a desired pressure in chamber 115 during the MOVPE process. Processor 170 can also provide the control portion to implement an automated in situ feedback system which controls the thickness and properties of both the growing film and the substrate as it is being removed to maintain critical thickness values throughout the deposition process.

In one embodiment, calibration data can be provided by ex situ measurements, which can provide various measurements, such as of the thickness and properties of the film and substrate, map the stress and dislocation density across the sample, and measure the optical and electronic properties of the films. For example, photoluminescence measurements can be performed using illumination above the band gap. For instance, when GaN is used, 351 nm light (=3.53 eV) can be utilized which is above the band gap of GaN (~3.4 eV). In another embodiment, X-ray diffraction can be used to map dislocation density and strain as referenced in "Spatially resolved distribution of dislocations and crystallographic tilts in GaN layers grown on Si(111) substrates by maskless cantilever epitaxy", *Journal of Applied Physics* 100(5): 053103, the disclosure of which is hereby incorporated by reference. Measurements can be obtained for the critical thickness at which defects nucleate as referenced in "Critical thickness of GaN thin films on sapphire(0001)", *Applied Physics Letters* 69(16): 2358-2360, the disclosure of which is hereby incorporated by reference. Additionally, a variety of ex-situ generalized ellipsometry techniques can be used to characterize strain and surface morphology.

Figure 2:
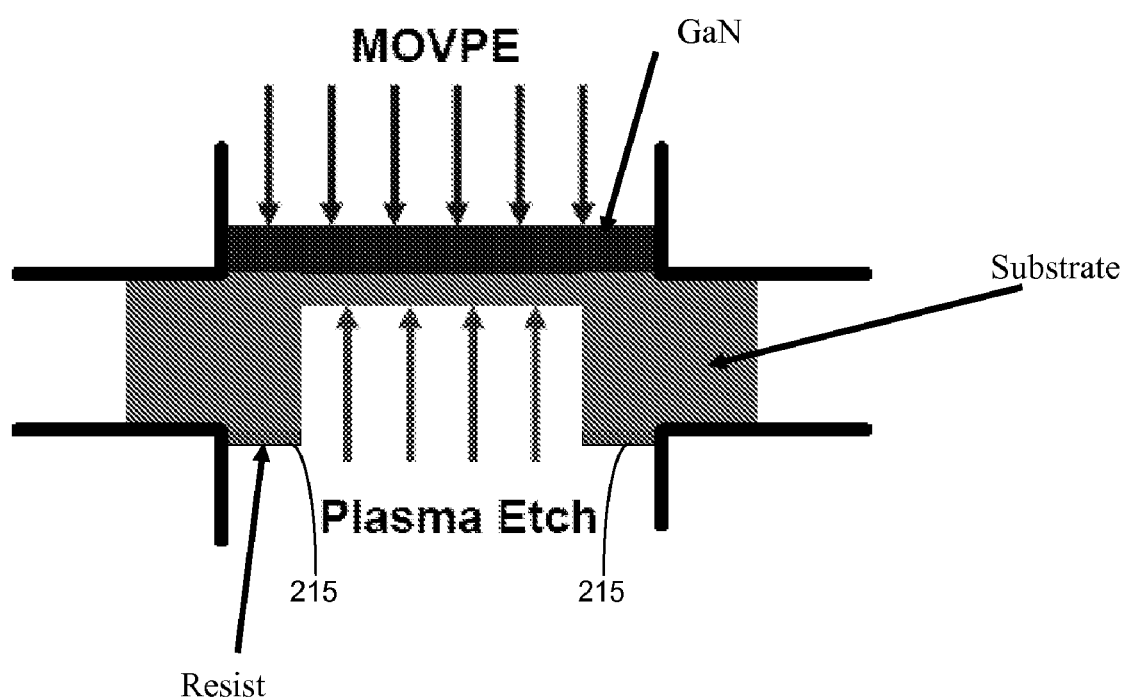
FIG. 2 shows a cross sectional view of a film deposition and removal process according to an exemplary embodiment of the present invention, wherein a MOVPE process proceeds on the topside of a wafer while an etch process is used on the backside of the wafer.

FIG. 2 shows a cross sectional view of a simultaneous GaN film deposition and removal process according to one exemplary embodiment, wherein a MOVPE process proceeds on the topside of a wafer simultaneously while a plasma etch process proceeds on the backside of a wafer. In another embodiment, a buffer layer can be utilized on the substrate. For instance, the deposition of an optional buffer layer, such as AlN, on one or both sides of the substrate can be performed prior to the MOVPE of the film in the dual-chamber reactor 100. In one embodiment, this buffer layer may be deposited in a separate chamber, e.g., a sputtering system. For instance, the edges of the initial single crystal substrate can be loosely anchored, while exposing the back end of the central region of the substrate to a plasma etching process to reduce its thickness during MOVPE deposition on the top of the substrate.

In one embodiment, a minimum thickness of the substrate which still permits handling can be used. For instance, the thickness of the edges of the substrate can range from a few hundred nm to a few microns, while the thickness of the thin region may range from a few nm to tens of nm. In one embodiment, the central region of the substrate may be completely eliminated (e.g., by supporting the film on the edges of the substrate and through use of a pressure differential). In another embodiment, thinned regions can be completely eliminated even if there is not a large continuous central region, where there is a continuous path of connected thick regions that support the film on regions that have zero thickness of the substrate.

As shown in FIG. 2, a photoresist pattern 215 based on lithography can be used to define the area for plasma etching. Thus, as the growth of the GaN or other epitaxial film 225 on the top and the thinned substrate from the exposed area at the bottom proceeds, the subsequent growth of GaN can result in an essentially defect-free film. For areas remote to the exposed central area which are shown covered by photoresist, no thinning of the substrate may take place; hence, the dislocation densities expected in the GaN film at the ends can correspond to the case of GaN growth on a substrate of finite thickness (depending on the initial thickness of the substrate). Improved films are believed to be produced since the central region is remotely located from the defective ends and free lateral movement is permitted, local equilibrium conditions will dictate the conditions for GaN film growth. Through appropriate parameter selection, such as obtainable through modeling, the substrate fixture can be designed such that stresses in the compliant substrate during thinning do not result in the creation of defects or cracks in the substrate or the GaN film. An additional factor which can be controlled through proper choice of operating parameters is the generation of surface stress waves during MOVPE deposition on thin substrates that may result in increased stress concentrations in the GaN film causing dislocation nucleation.

As the substrate is thinned, the stress applied by the growing film may tend to bend the sample. Excessive bending may lead to the formation of defects or even to failure. In one embodiment, to prevent this bending, varying of the differential pressure between the respective chambers can be utilized, as well as controlling the growth and etching processes to match each other and remain at sufficiently low levels to prevent surface perturbations during the critical stage. Closed-loop control can be implemented by measuring sample bending using the parallel-beam laser reflection technique or other suitable techniques and providing the data to processor controller 170.

In some embodiments, improved films can be produced by using a non-constant deposition rate. For example, regarding GaN deposition, a very slow GaN growth rate (e.g., at lower temperatures) and substrate etch rate during the critical stage of the process can be used to control both the nucleation and growth process as well as to minimize perturbations, followed by a higher growth rate once the critical stage is surpassed.

Although not needed to practice the claimed invention, Applicants not seeking to be bound by theory, present the following theoretical aspects believed to be associated with the present invention. A single crystal epitaxial film growing on a substrate grown by a vapor phase deposition process (e.g., thermal or electron beam evaporation, and sputtering) is subjected to an internal stress due to the lattice mismatch between the film and the substrate. When the thickness of the film approaches a critical thickness, the elastic stress in the film due to the epitaxial constraint imposed by the substrate is relieved by the formation of interface dislocations and other defects. As noted above, the critical thickness increases as the substrate thickness decreases. Thus, by thinning the substrate as film growth proceeds, the formation of interface dislocations and other defects can be significantly reduced.

The exemplary embodiments described herein are expected to enable improved electronic devices across a broad range of technologies that are based on junction comprising devices including epitaxial layers. For example, for solid-state lighting devices (e.g., LEDs) typically constructed using conventional processing on GaN thick film templates grown on single crystal sapphire substrates, the presence of a high density of dislocations ($10^9/cm^2$ or higher) can result in a significant degradation in device efficiencies and lifetimes, since these defects act as non-radiative and scattering centers for electron transport. The exemplary embodiments can reduce the density of dislocations to $<10^6/cm^2$. The exemplary embodiments are also expected to be particularly helpful in overcoming the poor (5%) Internal Quantum Efficiency (IQE) of green LED devices based on high indium (20% or higher) containing $In_xGa_{1-x}N$, typically grown on GaN buffers containing high dislocation densities. While the understanding of the factors resulting in the poor IQE's of indium containing green LED's is still being actively studied within current programs, and strategies to increase the indium content are being pursued (e.g., by biaxial strain), it is clear that a substantial reduction in the dislocation densities of GaN substrates will have a major impact in improving the IQE's and lifetimes of all LED devices. The exemplary embodiments are also expected to significantly improve performance of $In_xGa_{1-x}N$ based devices. $In_xGa_{1-x}N$ based devices are one of the most promising materials for optoelectronic devices operating in the ultraviolet to blue wavelengths.

Other colors can also be generated with suitable doping, red, green, yellow. In the exemplary embodiments, large single crystal GaN film substrates are being grown on which suitable LED or other devices can be fabricated. In one embodiment, there is direct deposit of the actual LED materials (doped GaN and subsequent layers) without the need of a GaN substrate.

The present disclosure can also be applied to the growth of thin Si epitaxial layers on SiGe (on a Si wafer) where the lattice mismatch between the two imparts strain in Si, hence referred as "strained Si." Strained Si increases the electron/hole mobility significantly. In one embodiment, SiGe can be grown on a Si wafer while simultaneously thinning from the backside, so that the SiGe should have a lower dislocation density. The subsequent step involving epi deposition of Si below the elastic limit on SiGe can result in improved properties of strained Si, since the substrate (SiGe) has a lower defect concentration and so less defects are likely to be propagated into the strained Si.

It is to be understood that while the invention has been described in conjunction with the preferred specific embodiments thereof, that the foregoing description as well as the examples which follow are intended to illustrate and not limit the scope of the invention. Other aspects, advantages and modifications within the scope of the invention will be apparent to those skilled in the art to which the invention pertains.

We claim:

1. A method of forming a low defect epitaxial film, comprising the steps of:
    providing a single crystal substrate having a first side and a second side opposite to said first side;
    depositing an epitaxial layer on the first side of the substrate while removing material from the second side of the substrate; and
    lowering the rate of deposition and removal of material during a critical stage of the process to control nucleation.

* * * * *